(12) United States Patent
Uchida

(10) Patent No.: US 7,907,326 B2
(45) Date of Patent: Mar. 15, 2011

(54) REFLECTING APPARATUS

(75) Inventor: Shinji Uchida, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 833 days.

(21) Appl. No.: 11/749,993

(22) Filed: May 17, 2007

(65) Prior Publication Data

US 2007/0286035 A1 Dec. 13, 2007

(30) Foreign Application Priority Data

May 23, 2006 (JP) ................................. 2006-142720

(51) Int. Cl.
G02B 26/00 (2006.01)
(52) U.S. Cl. ......................................... 359/291
(58) Field of Classification Search .......... 359/290–291, 359/223.1, 224.1; 355/53, 72, 75, 77; 369/44.14–44.16
See application file for complete search history.

(56) References Cited

U.S. PATENT DOCUMENTS

| | | | |
|---|---|---|---|
| 6,445,481 B2* | 9/2002 | Aoki ........................... | 359/198.1 |
| 6,464,363 B1* | 10/2002 | Nishioka et al. .............. | 359/846 |
| 6,840,638 B2 | 1/2005 | Watson | |
| 6,842,277 B2 | 1/2005 | Watson | |
| 6,893,045 B2 | 5/2005 | Inoue et al. | |
| 6,938,920 B2 | 9/2005 | Inoue et al. | |
| 6,986,528 B2 | 1/2006 | Inoue et al. | |
| 2004/0017620 A1* | 1/2004 | Kaneko et al. ............... | 359/824 |
| 2004/0017623 A1 | 1/2004 | Watson | |
| 2004/0027632 A1 | 2/2004 | Watson | |
| 2004/0212794 A1* | 10/2004 | Mizuno .......................... | 355/72 |
| 2006/0082751 A1* | 4/2006 | Moors et al. .................... | 355/69 |
| 2007/0001441 A1 | 1/2007 | Inoue et al. | |
| 2008/0130090 A1* | 6/2008 | Aubuchon .................... | 359/291 |

FOREIGN PATENT DOCUMENTS

| | | |
|---|---|---|
| JP | 8-334708 | 12/1996 |
| JP | 2002-243918 | 8/2002 |
| JP | 2004-064076 | 2/2004 |
| JP | 2005-004146 | 1/2005 |

\* cited by examiner

Primary Examiner — Jessica T Stultz
Assistant Examiner — Mahidere S Sahle
(74) Attorney, Agent, or Firm — Fitzpatrick, Cella, Harper & Scinto

(57) ABSTRACT

A reflecting apparatus that includes a mirror having an axis. A holding unit holds the mirror via an elastic member. A first actuator positions the mirror by driving the holding unit. A second actuator deforms the mirror and includes a magnetic member attached to the mirror, and an electromagnet arranged to oppose the magnetic member. The electromagnet generates an attraction force between the magnetic member and the electromagnet. A base supports the electromagnet, and a spring interposed between the base and the mirror applies a force between the magnetic member and the electromagnet in a direction opposite to that of the attraction force. A rigidity of the spring in a direction parallel to the axis is less than that of the elastic member in the direction parallel to the axis.

19 Claims, 16 Drawing Sheets

SECTION A-A'

SECTION B-B'

REFRIGERANT INLET

REFRIGERANT OUTLET

SECTION A-A'

REFLECTING APPARATUS

This application claims the benefit of Japanese Patent Application No. 2006-142720, filed May 23, 2006, which is hereby incorporated by reference herein in its entirety.

BACKGROUND OF THE INVENTION

1. Field of the Invention

The present invention relates to a reflecting apparatus and, more particularly, to a reflecting apparatus, which constitutes a part of a projection optical system of an exposure apparatus.

2. Description of the Related Art

Conventionally, in photolithography for manufacturing, e.g., a semiconductor element, a pattern formed on a mask (or reticle) is projected and transferred by exposure onto a photosensitive substrate, such as a wafer, via a projection optical system. In this projection exposure, a projection exposure apparatus, such as a step and repeat exposure apparatus (a so-called stepper) or a step and scan exposure apparatus (a so-called scanner) is used.

An apparatus of this conventional type utilizes exposure light, such as a g-line (wavelength: 436 nm) or an i-line (wavelength-365 nm). These days, the apparatus often adopts, e.g., KrF excimer laser light (wavelength: 248 nm) or ArF excimer laser light (wavelength: 193 nm).

A catadioptric optical system is available as a projection optical system for projection exposure with exposure light having the above-described wavelength ranges. The catadioptric optical system can obtain a reduction ratio high enough for mask pattern projection and can downsize the projection optical system itself.

Unfortunately, even such a catadioptric optical system generates aberration due to, e.g., a manufacturing error or an assembly error of optical elements, which form the optical system, or thermal deformation of an optical element, which is caused upon partially absorbing exposure light. This aberration degrades the quality of the pattern image projected onto the photosensitive substrate.

In view of this, there is proposed an apparatus, which comprises various kinds of reflecting optical elements, e.g., reflecting mirrors, such as a plane mirror and a concave mirror, and changes the shape of the surface (reflection surface) of the mirror to correct the aberration of the optical system.

FIG. 16 shows a reflecting apparatus described in Japanese Patent Laid-Open No. 2004-64076 as an example of a reflecting apparatus whose surface contour is changeable.

This reflecting apparatus comprises a mirror 20 and a low-rigidity actuator 30. The low-rigidity actuator 30 locally deforms the rear surface (the lower surface in FIG. 16) of the mirror 20 at a predetermined position. The low-rigidity actuator 30 utilizes, e.g., a voice coil motor, an air-pressure actuator, or an EI core actuator.

In the reflecting apparatus, which deforms the surface contour of the mirror, the actuator used for deformation generates heat. This often results in unintended deformation of the mirror.

If one increases the magnitude of a force relative to the heat amount in consideration of the heat generation, the movable element of the actuator may become larger and more complicated. In this case, disturbing vibration from, e.g., the floor, often vibrates the mirror.

If one circulates a refrigerant by arranging a refrigerant pipe to cool the movable element (which acts as a heat generation portion) of the actuator in consideration of the heat generation, vibration from the refrigerant pipe vibrates the mirror.

SUMMARY OF THE INVENTION

It is an object of the present invention to provide a reflecting apparatus capable of suppressing heat generation by an actuator used to deform the contour of the surface (reflection surface) of a mirror.

According to one aspect, the present invention provides a reflecting apparatus comprising a mirror, a first actuator configured to position the mirror, and a second actuator configured to deform the mirror, wherein the second actuator includes a magnetic member attached to the mirror, and an electromagnet arranged to oppose the magnetic member in a noncontact manner.

Such a reflecting apparatus suppresses heat generation by the second actuator used to deform the surface contour of the mirror. In addition, the reflecting apparatus can be preferably used as one constituent component of a projection optical system of an exposure apparatus.

Further features of the present invention will become apparent from the following description of exemplary embodiments with reference to the attached drawings.

DESCRIPTION OF THE EMBODIMENTS

First Embodiment

Figure 1A:
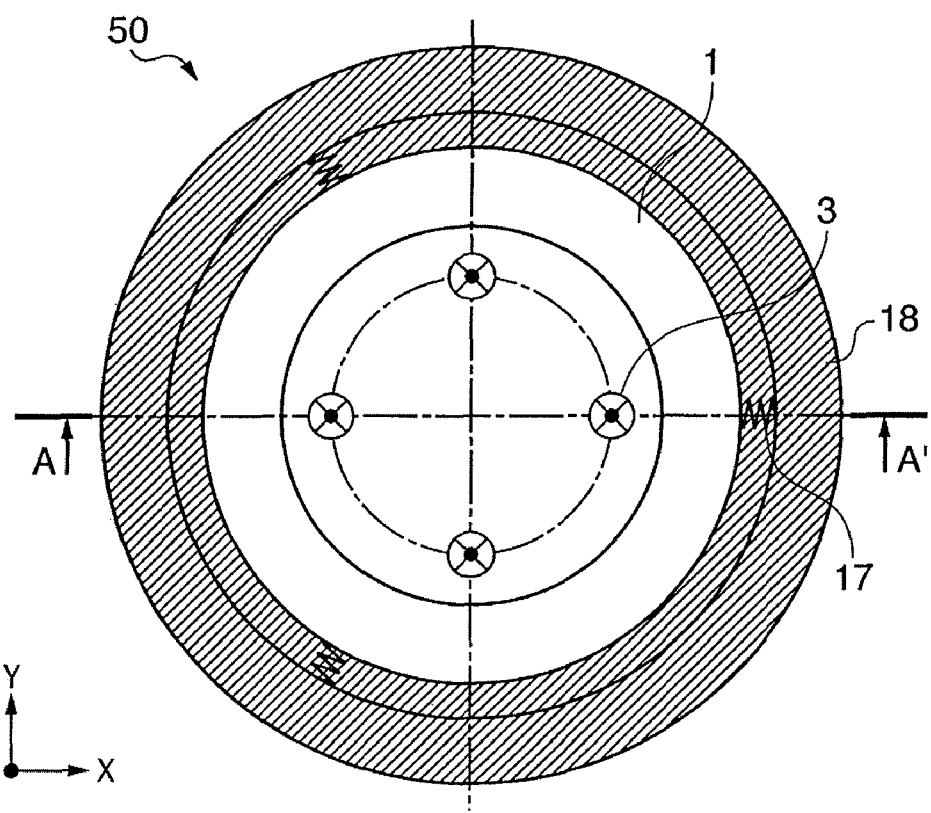
FIGS. 1A and 1B are views showing the schematic arrangement of the first embodiment.
Figure 1B:
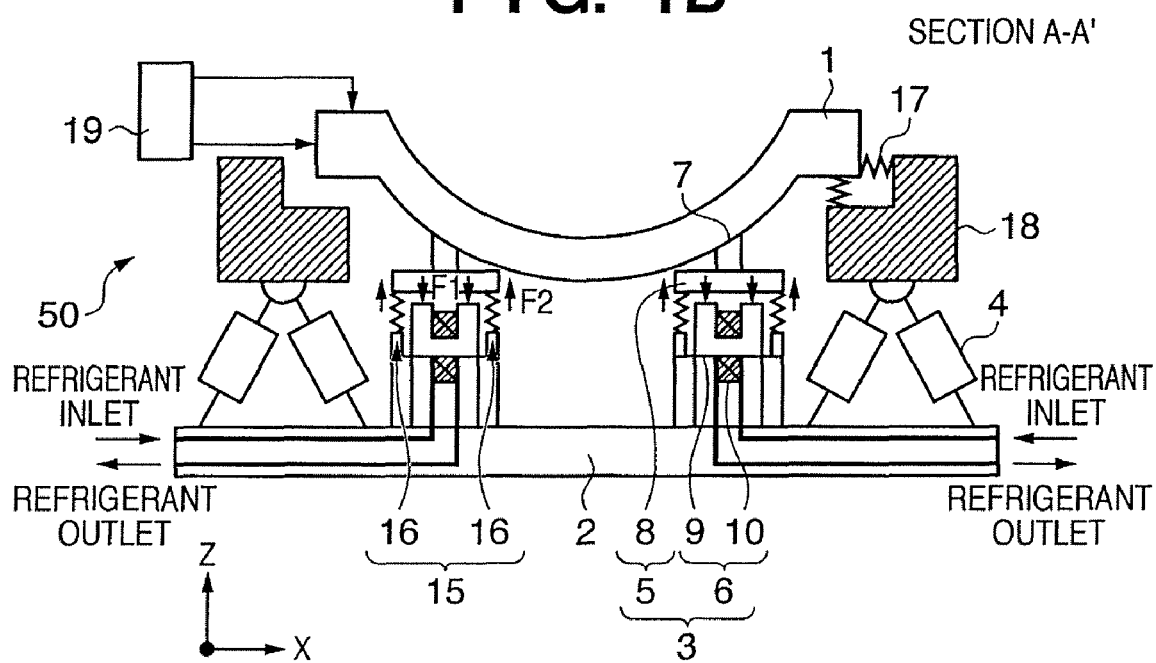

FIGS. 1A and 1B are views showing a reflecting apparatus according to the first embodiment. FIG. 1A is a top view, and FIG. 1B is a sectional view, taken along a line A-A' in FIG. 1A.

A reflecting apparatus 50 comprises a mirror 1 having a concave reflecting surface, and a base 2 for supporting the mirror 1. The reflecting apparatus 50 also comprises a plurality of actuators 4 for positioning the mirror 1, a plurality of electromagnet units 3 for deforming the mirror 1, and a plurality of preload units 15. These constituent components 4, 3, and 15 are interposed between the mirror 1 and the base 2.

A ring-like intermediate member 18 holds the mirror 1 via elastic members 17 that exhibit a spring characteristic. The elastic members 17 are arranged at, e.g., three positions on the circumference of a single circle at an angular interval of 120°. The intermediate member 18 has high rigidity and is driven in the directions of X-, Y-, or Z-axes and the rotational directions (tilt directions) about these axes by the actuators 4 interposed between the intermediate member 18 and the base 2. The shape of the intermediate member 18 is not limited to a ring-like shape, and it may have another shape.

A laser interferometer 19 measures the position of the mirror 1 to drive the actuator 4 based on the measurement result. This makes it possible to control the position and orientation of the mirror 1. The measurement unit for measuring the position of the mirror 1 is not limited to a laser interferometer, and another measurement unit may be used.

It is preferable to measure, as a representative position, the position of a portion of the mirror 1 that is less susceptible to deformation.

The electromagnet unit 3 comprises a movable element 5 and stator 6. The movable element 5 can comprise an I core 8 attached to the rear side (a side opposite to the reflection surface) of the mirror 1 via a connecting member 7. The stator 6 can comprise a U core 9 arranged to oppose the I core 8 in a noncontacting manner, and a coil 10 wound around the U core 9. The stator 6 can also comprise a cooling jacket for cooling the coil. The cooling jacket is not illustrated in FIGS. 1A and 1B, and will be described later with reference to FIGS. 3A to 3D. The U core 9 is fixed to the base 2. It is desirable that the U core and I core are made of a high-permeability material (magnetic member), especially, a high-permeability material that exhibits a poor hysteresis characteristic. Examples of such a material are permalloy, silicon steel, and soft iron.

Figure 2A:
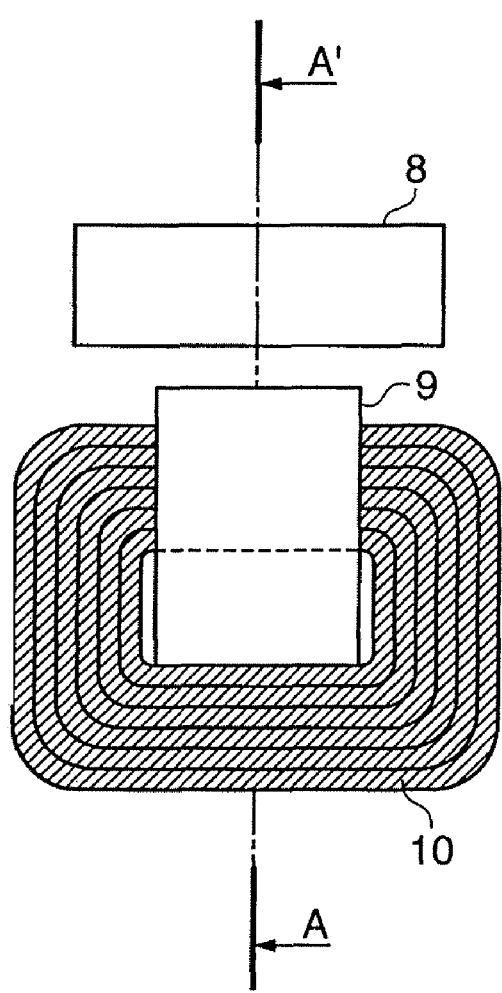
FIGS. 2A and 2B are views showing an electromagnet unit.
Figure 2B:
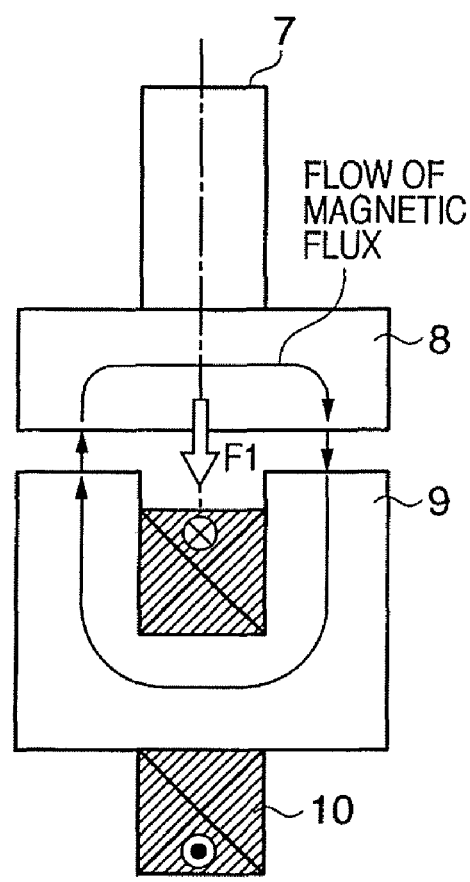

FIGS. 2A and 2B are views showing details of the electromagnet unit 3. FIG. 2B is a sectional view taken along a line A-A' in FIG. 2A. As described above, the I core 8 and U core 9 are arranged to form a predetermined gap. Supplying a current to the coil 10 excites the U core 9. The magnetic flux runs through the I core 8 and the gap to form a magnetic circuit. This produces a magnetic attraction force F1 between the U core 9 and the I core 8. Controlling the current supplied to the coil 10 makes it possible to control a force (attraction force) the electromagnet unit 3 applies on the mirror 1, i.e., a force which deforms the mirror 1.

Use of the electromagnet unit as an actuator for deforming the mirror in this way makes it possible to attain a higher heat generation efficiency than does use of a linear motor or a voice coil motor.

When a linear motor or a voice coil motor is used, and a coil having a high heat value is arranged on the mirror side as a movable element, the mirror deforms into an unintended contour due to the influence of heat generated by the coil.

In contrast, when a permanent magnet is arranged on the mirror side as a movable element, it is necessary to increase the sizes of the permanent magnet and yoke to improve the heat generation efficiency. This complicates the structure and increases the weight. The complicated structure makes it impossible to maintain the eigen value of the mirror. Consequently, the mirror becomes susceptible to, e.g., vibration from the floor.

Use of a high-permeability material for the movable element of the electromagnet unit in this way makes it possible not only to reduce the influence of heat on the mirror, but also, to simplify the structure. This makes it possible to maintain the eigen value of the mirror to be high. Consequently, the mirror becomes less susceptible to, e.g., vibration from the floor.

It is desirable to match the line of action of the attraction force F1 with the central axis of the connecting member 7, so that it causes no rotational moment. The line of action of the attraction force F1 may run through the barycentric position of the connecting member 7.

Figure 3A:
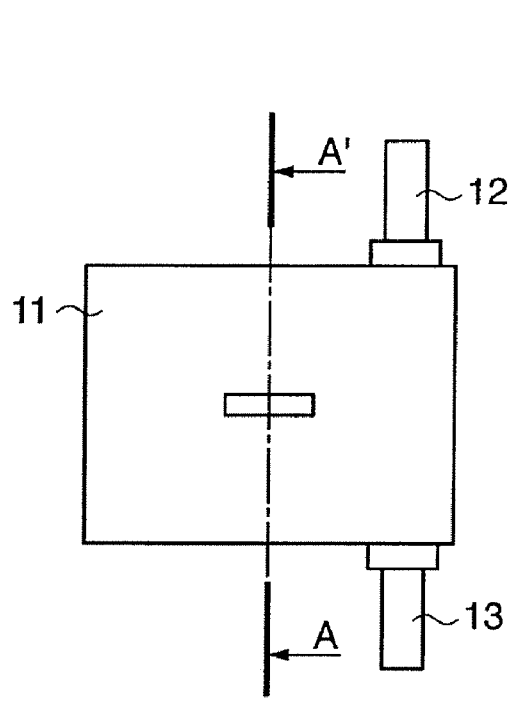
FIGS. 3A to 3D are views showing a cooling jacket.
Figure 3B:
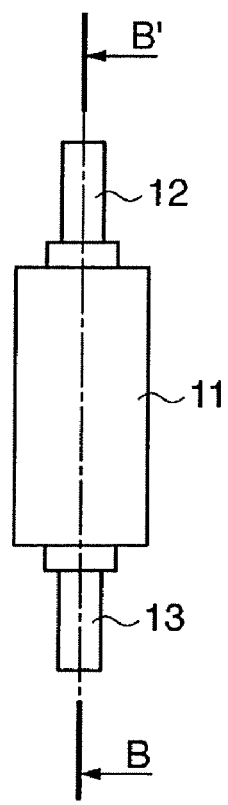
Figure 3C:
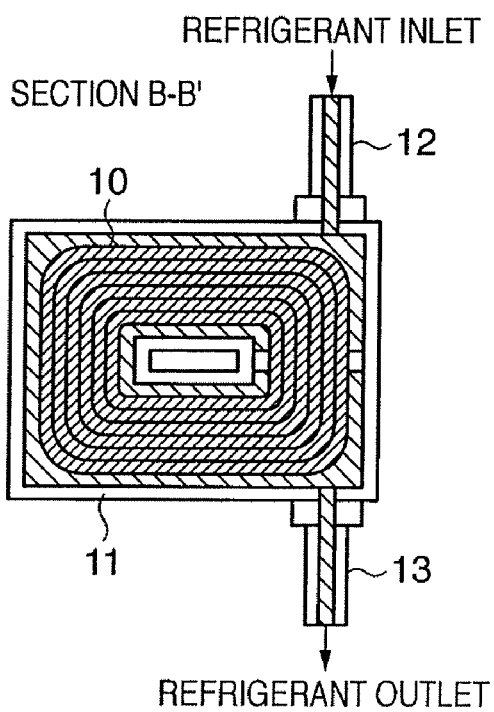
Figure 3D:
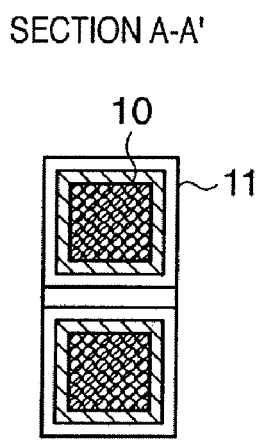

FIGS. 3A to 3D are views showing a cooling jacket for cooling the coil 10. FIGS. 3A and 3B are views showing the state in which the jacket encloses the coil. FIGS. 3C and 3D are sectional views taken along a line B-B' in FIG. 3B and a line A-A' in FIG. 3A, respectively.

A cooling jacket 11 is provided to cover the coil 10. The cooling jacket 11 includes an inlet 12 and an outlet 13 for supplying a refrigerant into the jacket. The inlet 12 and outlet 13 are connected to pipes. The other end of the pipes are connected to the flow paths formed in the base 2, as shown in FIG. 1B.

Supplying a refrigerant into the jacket makes it possible to cool the heated coil 10. It is also possible to control the temperature of the coil 10 by controlling the temperature of the refrigerant. The detailed arrangements of the pipe and flow path can be changed as needed.

When the coil of the electromagnet unit is arranged on the base side as a stator and cooled, it is possible not only to suppress the heat generated by the coil, but also, to prevent vibration by refrigerant circulation from acting on the mirror. It is, therefore, possible to deform the mirror into a desired contour with high accuracy, by reducing thermal deformation of the mirror or its surrounding members.

Figure 4A:
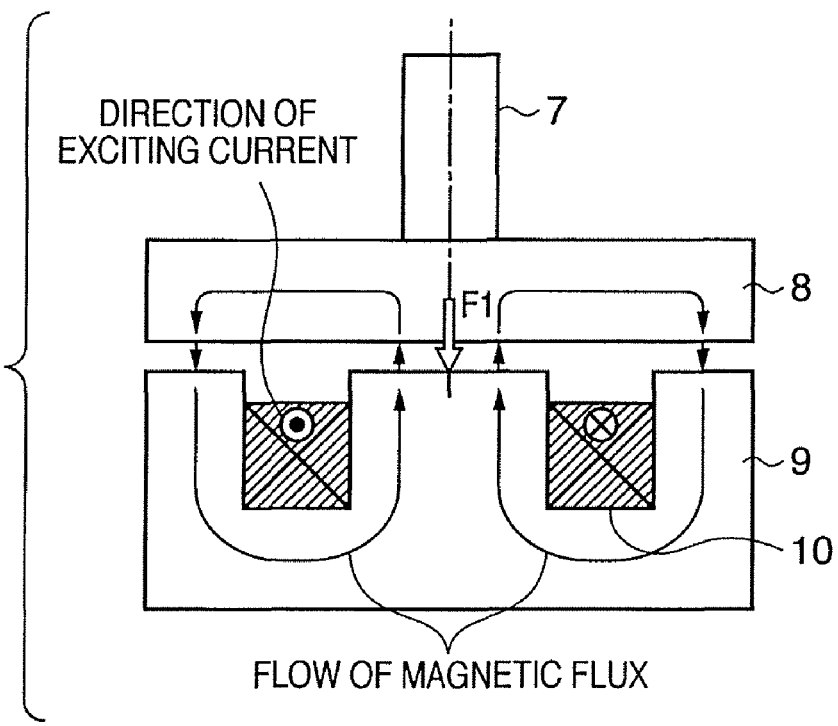
FIGS. 4A and 4B are views illustrating an example using an E electromagnet.
Figure 4B:
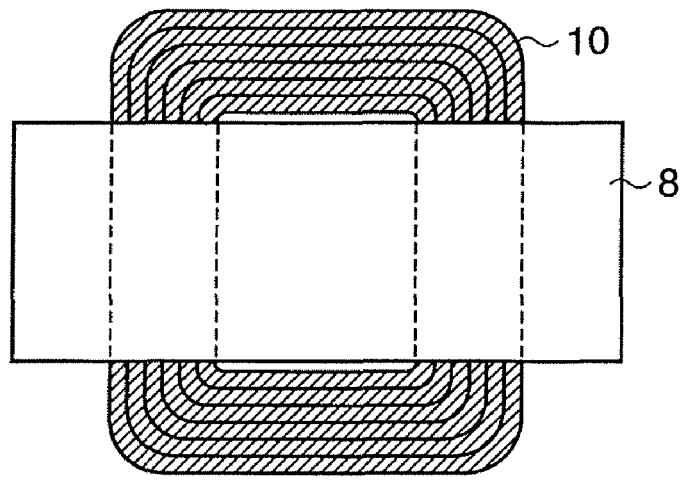

Although the electromagnet unit 3 comprises a U core in the above description, an E core may be substituted for it. FIGS. 4A and 4B show an example in which the electromagnet unit 3 comprises an E core 14. The function of the E core 14 is the same as that of the U core, and a description thereof will not be repeated.

The preload unit 15 will be explained with reference to FIGS. 1A and 1B again. The preload unit 15 is provided near each electromagnet unit 3. That is, four preload units are prepared for four electromagnet units in FIGS. 1A and 1B.

The preload unit 15 comprises a spring member 16 inserted between the stator 6 and movable element 5 of the electromagnet unit 3. Arranging the spring member 16 compressed by a predetermined amount in advance gives a preload force F2 to the electromagnet unit 3 in a direction (a direction opposite to that of the attraction force F1) in which the movable element 5 separates from the stator 6. The preload force F2 deforms the mirror 1.

It is desirable to match the line of action of the preload force with the central axis of the connecting member 7, so that the preload force F2 causes no rotational moment. The line of action of the preload force may run through the barycentric position of the connecting member 7. Although two spring members are arranged symmetrically with respect to the central axis of the connecting member 7 in FIG. 1A, an arbitrary number of spring members may be prepared.

The preload unit obviates the need for two electromagnets to push and to pull the rear side of the mirror. This makes it possible to decrease the heat value of the actuator for deformation. The preload means is desirably a spring member, which attains a simple structure. However, a permanent magnet, which produces a repulsive force or air pressure, is also applicable.

The spring member 16 desirably has low rigidity in the X and Y directions. The rigidity of the spring member 16 in the Z direction is set to be lower than that of the intermediate member 18. This is to suppress disturbing vibration conducted from, e.g., the floor from acting on the mirror via the preload unit 15, and the reflection surface from deforming or vibrating.

Mirror deformation using the above-described electromagnet unit 3 and preload unit 15 will be explained.

To deform the mirror using the electromagnet unit 3 and preload unit 15, the sum total of the attraction force F1 and preload force F2 is controlled as a mirror deformation force.

In the first embodiment, the spring member of the preload unit 15 has low rigidity and exhibits a large amount of preload. The amount of deformation of the reflection surface relative to the amount of preload is sufficiently small. For this reason, it is possible to regard the preload force F2 as being constant, irrespective of the deformation amount of the reflection surface. This makes it possible to control the forces (F1 and F2) acting on the mirror in accordance with the amount of current supplied to the coil of the electromagnet unit 3.

The gap between the movable element (I core 8) and stator (U core 9) of the electromagnet unit 3 is set to be sufficiently large relative to the amount of deformation of the reflection surface. For this reason, it is possible to regard the gap as being constant when a variation in gap upon deforming the reflection surface is ignored. Regarding the gap as being constant makes it possible to control the attraction force F1 by measuring and feedback-controlling the amount of current supplied to the coil.

The controller calculates a force necessary for deformation on the basis of the target contour, and supplies a current to the coil of each electromagnet unit to produce the calculated force. In addition, the controller causes an ammeter (not shown) to measure the value of a current supplied to each coil, and feedback-controls the current value based on the measurement result.

As described above, using the electromagnet unit 3 and preload unit 15, a force from a certain nominal position acts on (pushes or pulls) the mirror. This makes it possible to deform the reflection surface from a certain nominal contour.

The arrangements of the electromagnet unit 3 and preload unit 15 will be explained. Referring to FIGS. 1A and 1B, four electromagnet units 3 and four preload units 15 are arranged on the circumference of a single circle. However, their numbers and arrangements may be changed in accordance with optical aberration to be corrected. FIGS. 5A to 5D each illustrate an example in which their numbers and arrangements are changed.

Figure 5A:
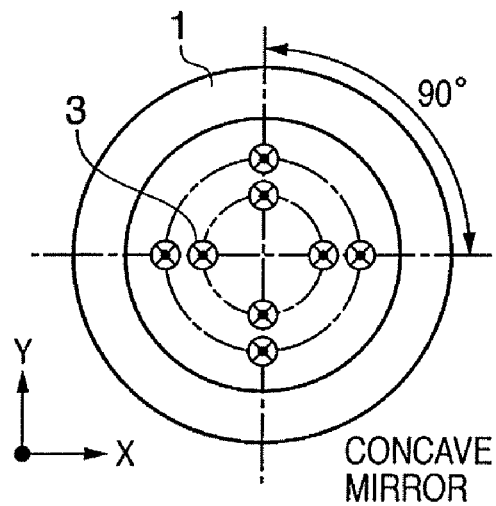
FIGS. 5A to 5D are views showing a modification of the arrangement of an electromagnet unit.

Referring to FIG. 5A, four electromagnet units 3 and four preload units 15 are arranged at four positions on the circumference of a single circle at an angular interval of 90°, and they are also arranged at four positions on the circumference of another circle at an angular interval of 90°.

Figure 5B:
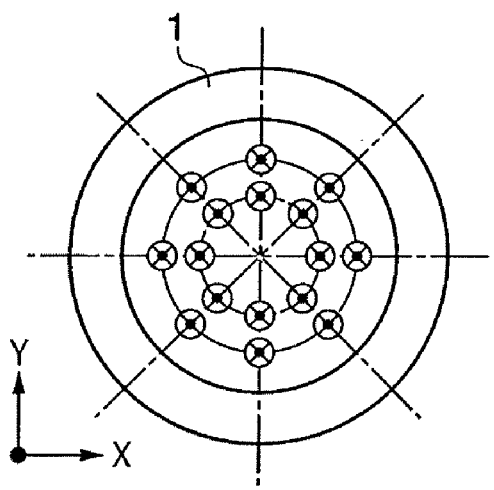

Referring to FIG. 5B, eight electromagnet units 3 and eight preload units 15 are arranged at eight positions on the circumference of a single circle at an angular interval of 45°, and they are also arranged at eight positions on the circumference of another circle at an angular interval of 45°.

Figure 5C:
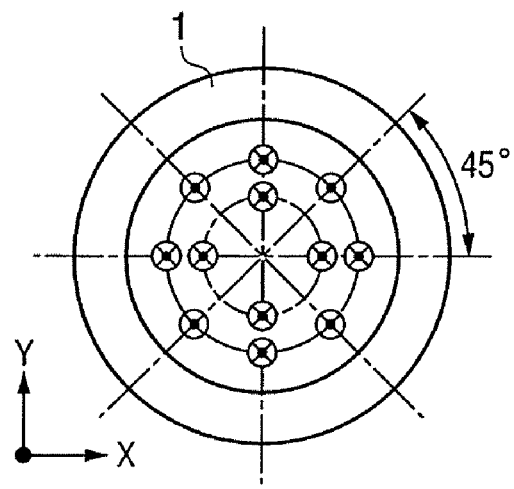

Referring to FIG. 5C, four electromagnet units 3 and four preload units 15 are arranged at four positions on the circumference of a single circle at an angular interval of 90°, and they are also arranged at eight positions on the circumference of another circle at an angular interval of 45°.

Figure 5D:
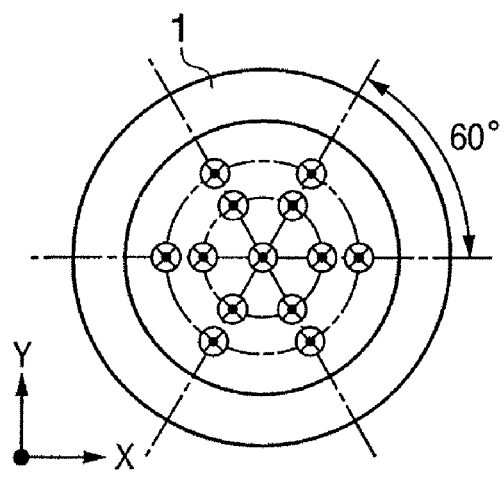

Referring to FIG. 5D, six electromagnet units 3 and six preload units 15 are arranged at six positions on the circumference of a single circle at an angular interval of 60°, and they are also arranged at six positions on the circumference of another circle at an angular interval of 60°.

Figure 6A:
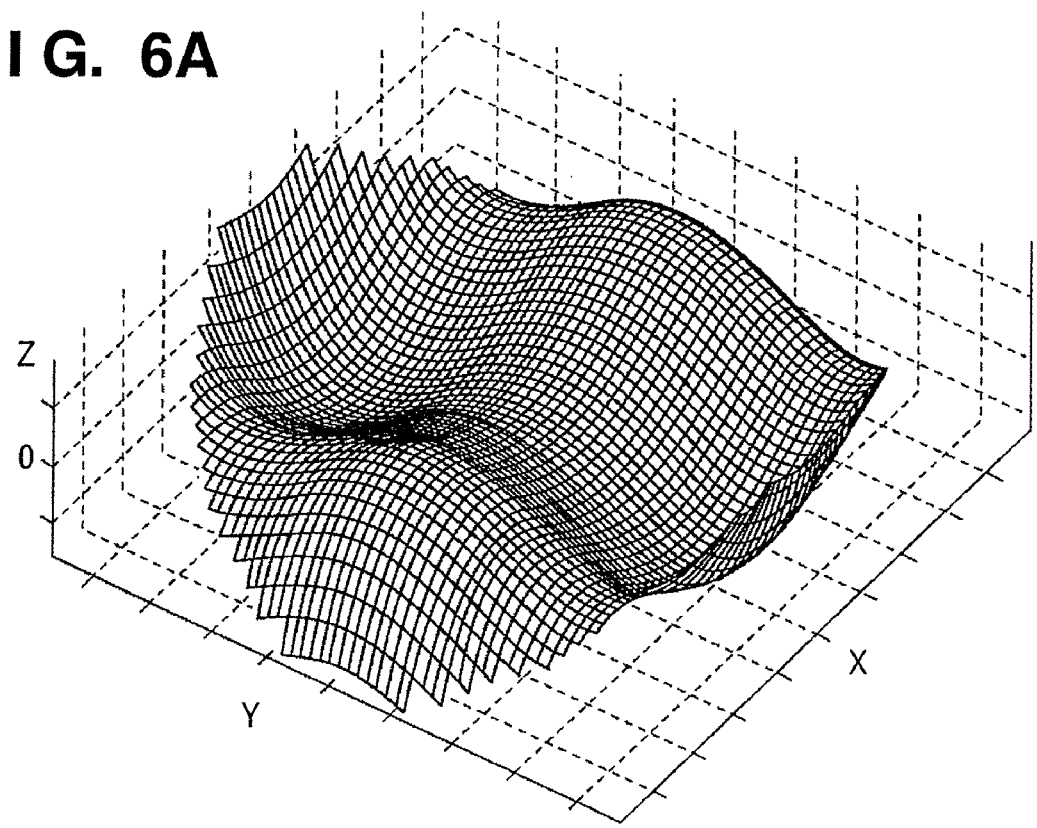
FIGS. 6A and 6B are views each showing the surface contour of a mirror.
Figure 6B:
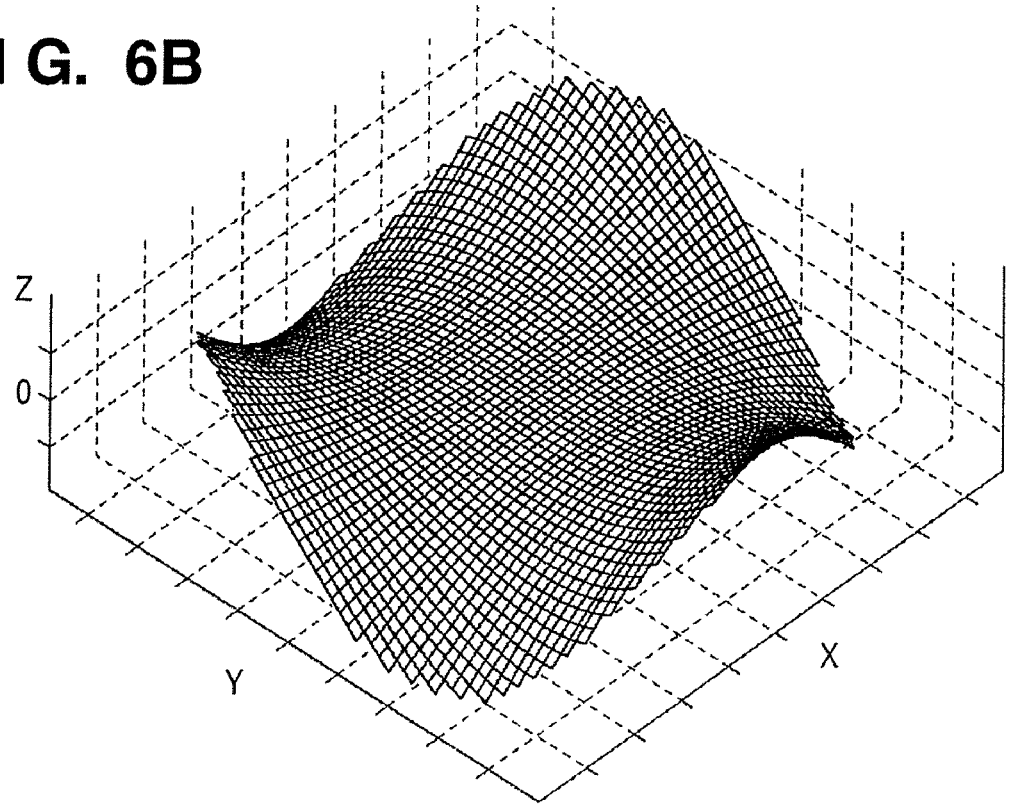

FIGS. 6A and 6B are views each showing the contour of the reflection surface upon deformation. Referring to FIG. 6A, the reflection surface has two convex portions and two concave portions. This contour can be formed when the electromagnet units 3 and preload units 15 are arranged at an angular interval of 45° or 90°, as shown in FIGS. 5A to 5C.

This contour can correct optical aberration containing a $2\theta$ component, such as a Z5 or Z12 term expressed by a Zernike function. Referring to FIG. 6B, the reflection surface has three convex portions and three concave portions. This contour can be formed when the electromagnet units 3 and preload units 15 are arranged at an angular interval of 60°, as shown in FIG. 5D. This contour can correct optical aberration containing a $3\theta$ component, such as a Z10 or Z19 term expressed by the Zernike function.

Figure 7C:
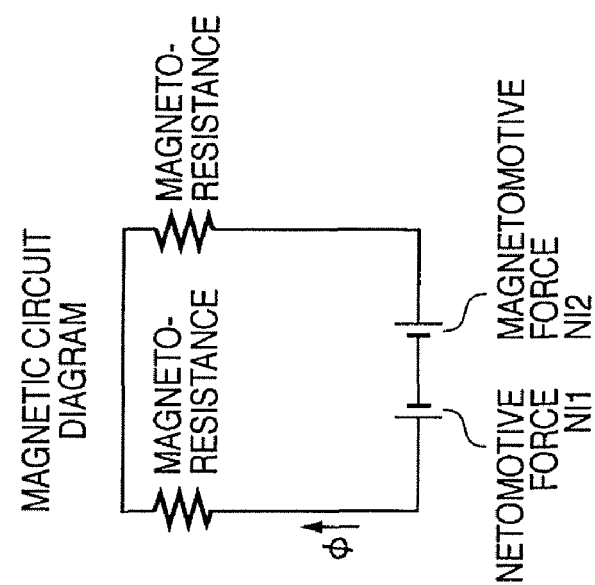
FIGS. 7A to 7C are views showing a modification of the electromagnet.
Figure 7B:
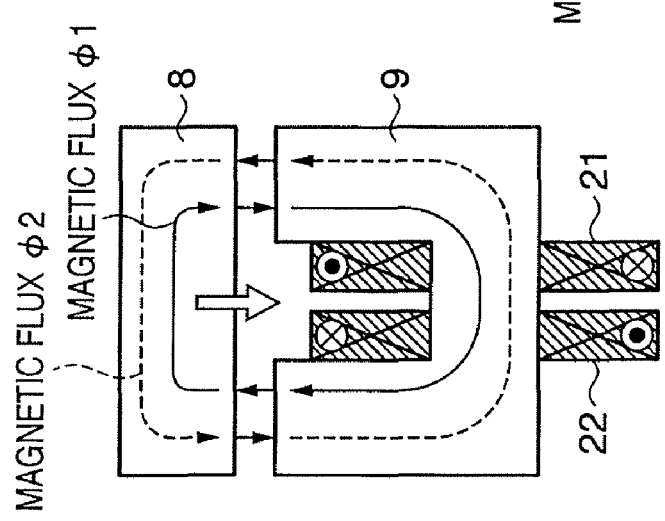
Figure 7A:
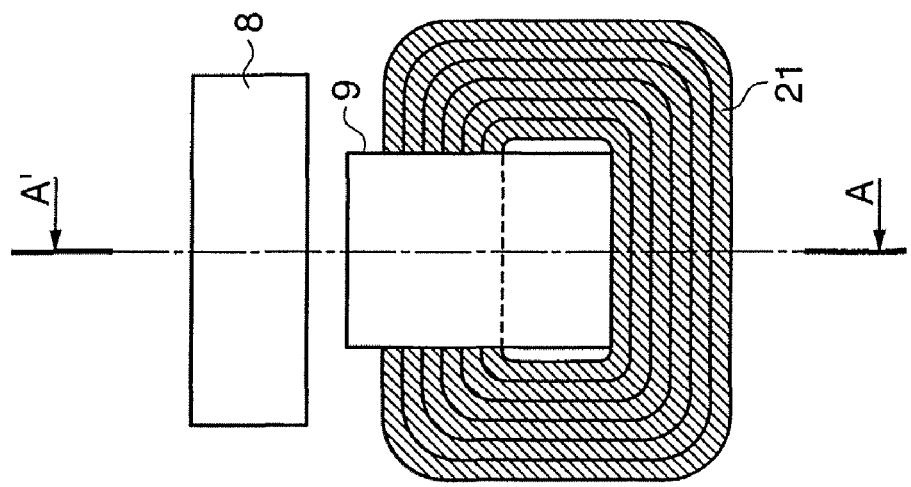

A modification of the arrangement of the electromagnet unit 3 will be explained with reference to FIGS. 7A to 7C. FIG. 7B is a sectional view taken along a line A-A' in FIG. 7A. In this modification, coils 21 and 22 are wound around the U core 9.

Currents flow to the coils 21 and 22 in opposite directions, as shown in FIG. 7B. Magnetic fluxes $\phi 1$ and $\phi 2$ generated by supplying currents to the coils 21 and 22 run in opposite directions on the magnetic circuit formed by the magnetic flux which run through the U core 9, I core 8, and gap. An attraction force F, which is produced between the movable element and the stator, and determined by the difference between the magnetic fluxes $\phi 1$ and $\phi 2$, is given by:

$$F = \frac{1}{2} \mu 0 / A \times (\phi 1 - \phi 2)^2 \qquad (1)$$

where $\mu 0$ is the permeability of the core material in a vacuum, A is the sectional area of the magnetic path, and the permeability is infinite.

When the gap is nearly constant, the magnetic fluxes $\phi 1$ and $\phi 2$ are proportional to exciting currents I1 and I2, respectively. In this case, equation (1) can be rewritten as:

$$F = \frac{1}{2} \mu 0 / A \times (\alpha \times I1 - \beta \times I2)^2. \qquad (1)'$$

A sum total W of the heat values of the exciting coils 21 and 22 is given by:

$$W = (R1 \times I1^2) + (R2 \times I2^2) \qquad (2)$$

where R1 is the electrical resistance of the exciting coil 21, and R2 is the electrical resistance of the exciting coil 22.

Equations (1)' and (2) reveal that controlling the two independent variables I1 and I2 makes it possible to control the attraction force F while maintaining the heat value W constant. That is, controlling the exciting currents I1 and I2 in accordance with the above equations makes it possible to control the attraction force F while maintaining the sum total W of the heat values of the exciting coils 21 and 22 constant.

As described above, when heat generated by the exciting coils 21 and 22 thermally deforms the mirror 1, intermediate member 18, or base 2, controlling the sum total W of the heat values, makes it possible to always maintain the amount of thermal deformation constant. Consequently, upon a change in the attraction force F, the reflection surface can deform into a well reproducible contour without changing the amount of thermal deformation.

Figure 8A:
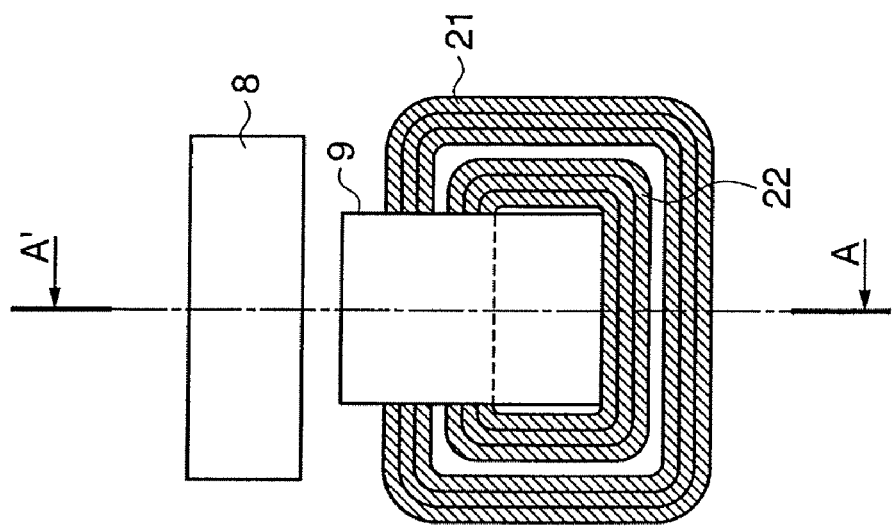
FIGS. 8A to 8C are views showing another modification of the electromagnet.
Figure 8B:
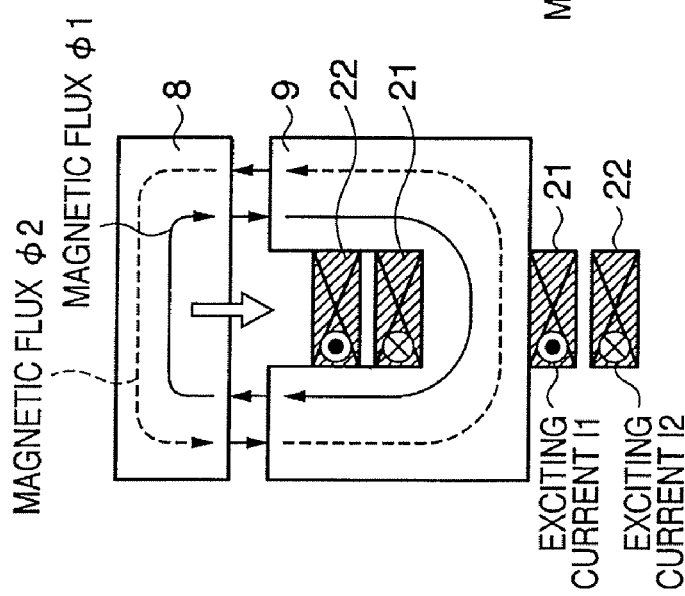
Figure 8C:
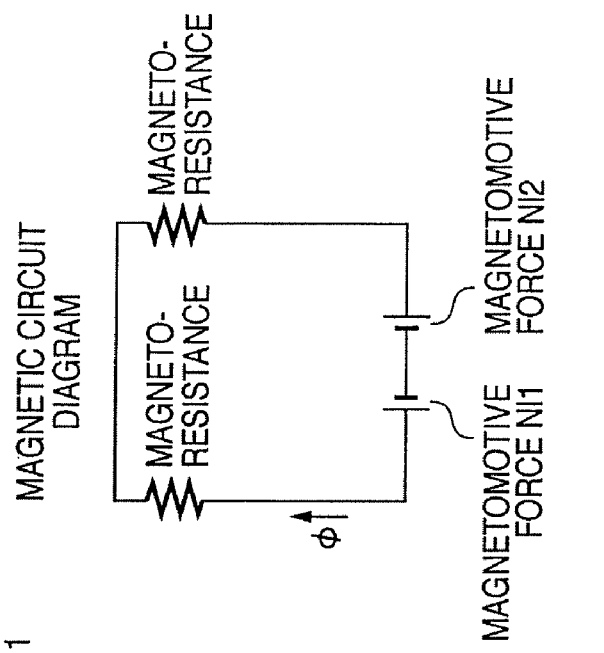
Figure 9A:
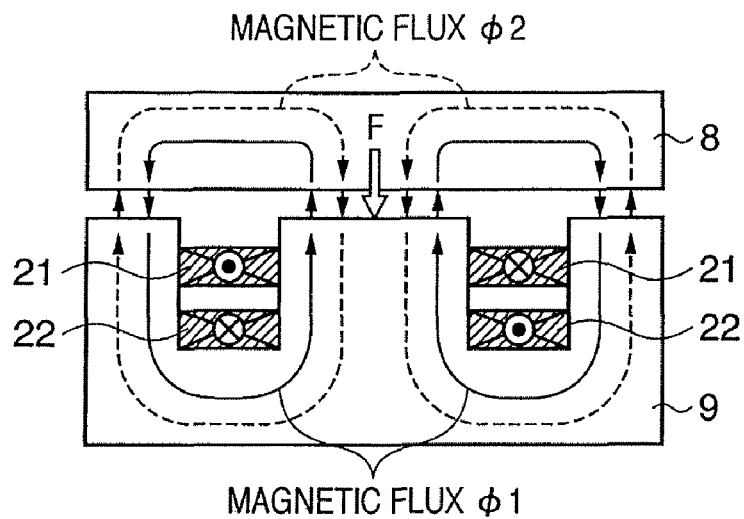
FIGS. 9A to 9C are views showing still another modification of the electromagnet.
Figure 9B:
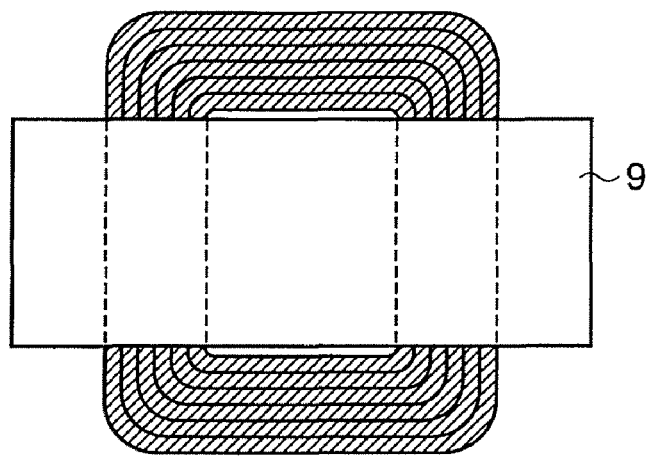
Figure 9C:
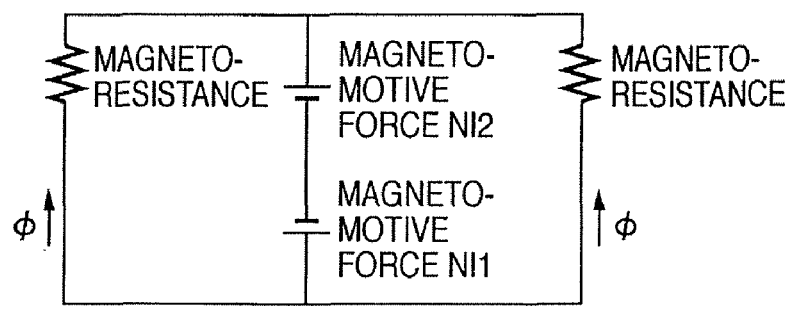

To achieve this control, it is necessary to prepare at least two exciting coils and make the generated magnetic fluxes run in opposite directions. It is also necessary to arrange the two exciting coils in the magnetic circuit in series (see FIG. 7C). Since the exciting coils are arranged in the magnetic circuit in series, the exciting currents I1 and I2 respectively produce magnetomotive forces NI1 and NI2. As shown in FIG. 8B, it is also possible to coaxially arrange the exciting coils 21 and 22 by winding them around the U core, to have different coil diameters. As shown in FIGS. 9A to 9C, an E core can be substituted for the U core.

Figure 10:
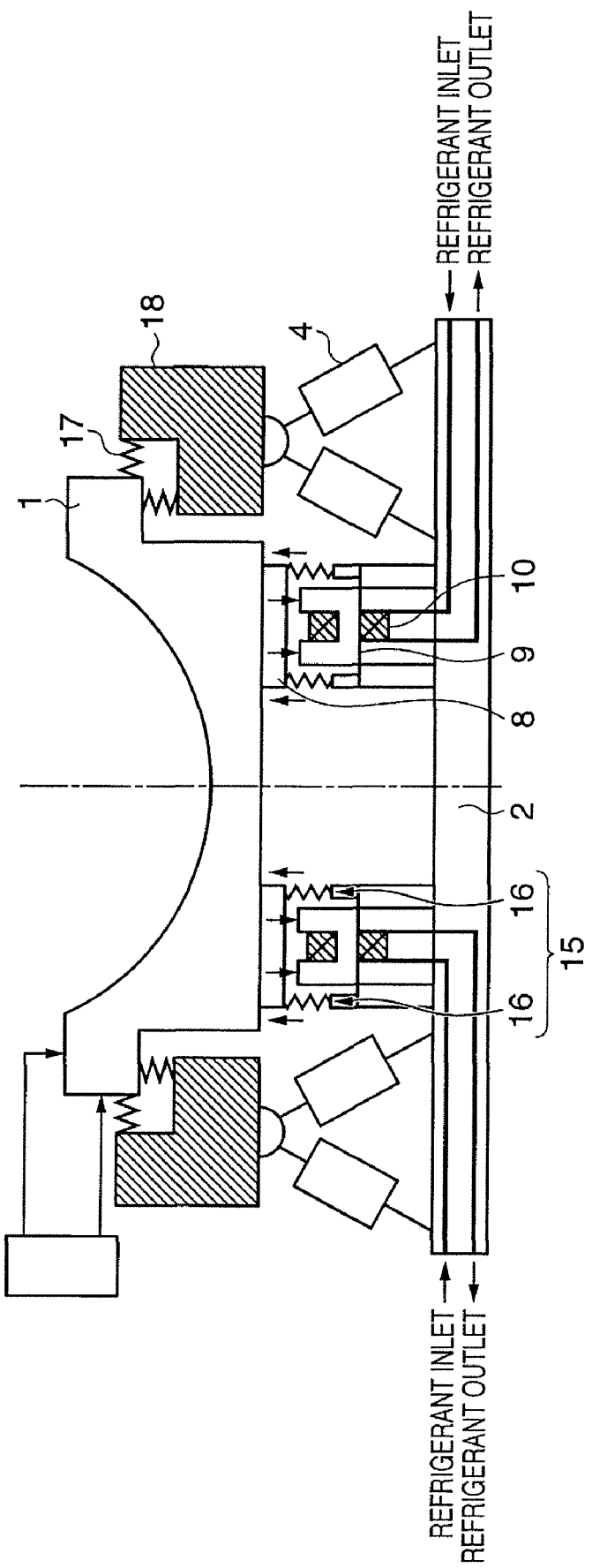
FIG. 10 is a view illustrating an example in which the rear surface of the mirror is flat.

FIG. 10 is a view showing another modification. FIG. 10 differs from the above-described embodiments in that the mirror 1 has a flat rear surface. As the mirror 1 has a flat rear surface, it can directly connect to the I core 8 without inserting any connecting member. Omitting any connecting member makes it possible to increase the eigen value of the mirror 1, to result in a reduction of deformation of the reflection surface due to vibration. As a matter of course, a connecting member may be used to further facilitate connection as compared with the above-described embodiments.

Figure 11:
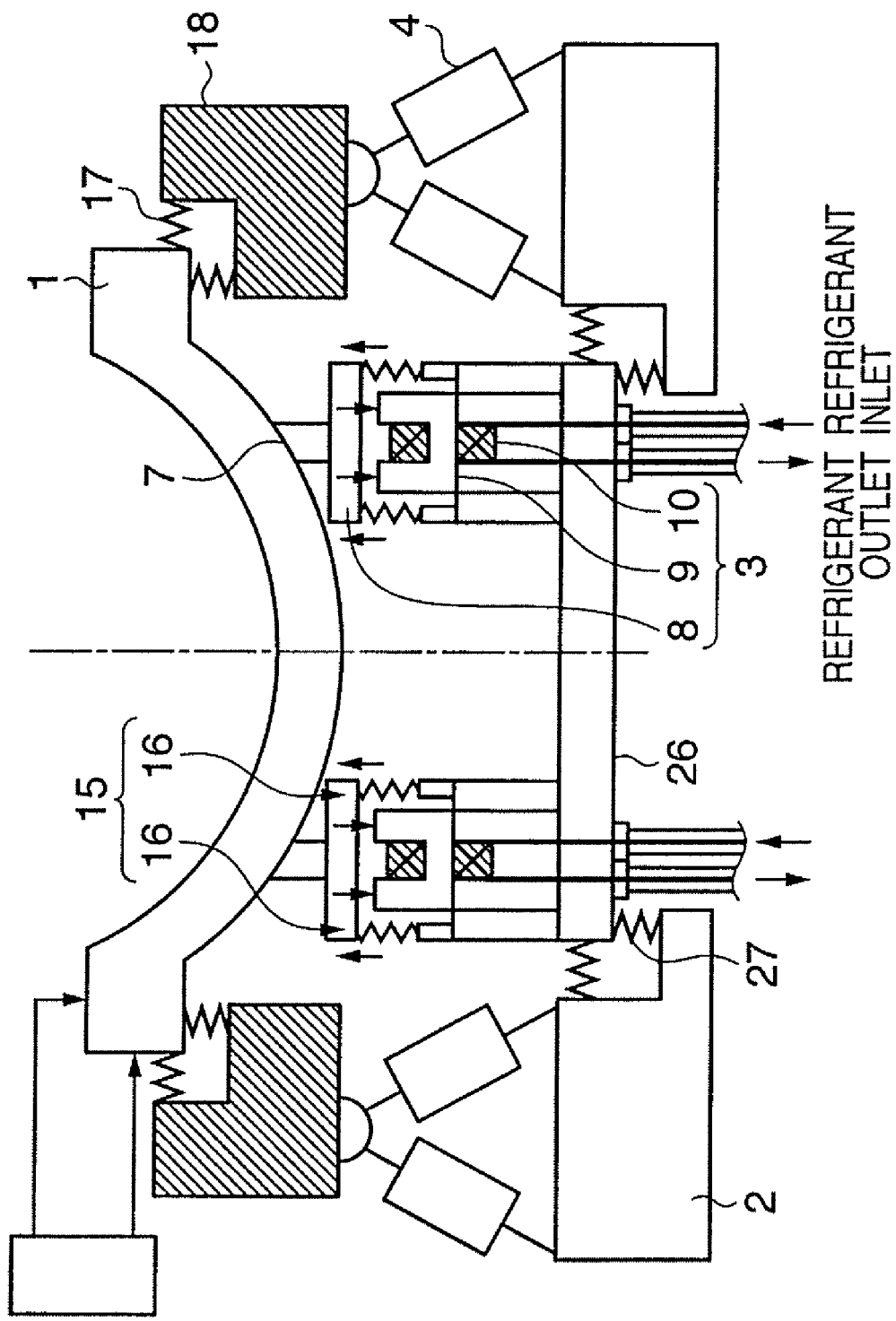
FIG. 11 is a view illustrating an example in which an actuator and an electromagnet unit are supported separately.

FIG. 11 is a view showing still another modification. Referring to FIG. 11, a base 26 for supporting the electromagnet unit 3 is provided separately from the base 2 for supporting the actuator 4.

The base 26 is provided on the base 2 via a low-rigidity elastic member 27. The rigidity of the elastic member 27 in the Z direction is set to be lower than that of the elastic member 17. Inserting the elastic member 27 between the bases 2 and 26 makes it possible to reduce the influence of disturbing vibration conducted from, e.g., the floor, via the base 26. This makes it possible to deform the reflection surface of the mirror 1 into a desired contour with high accuracy, while suppressing its unintended deformation and vibration.

Figure 12:
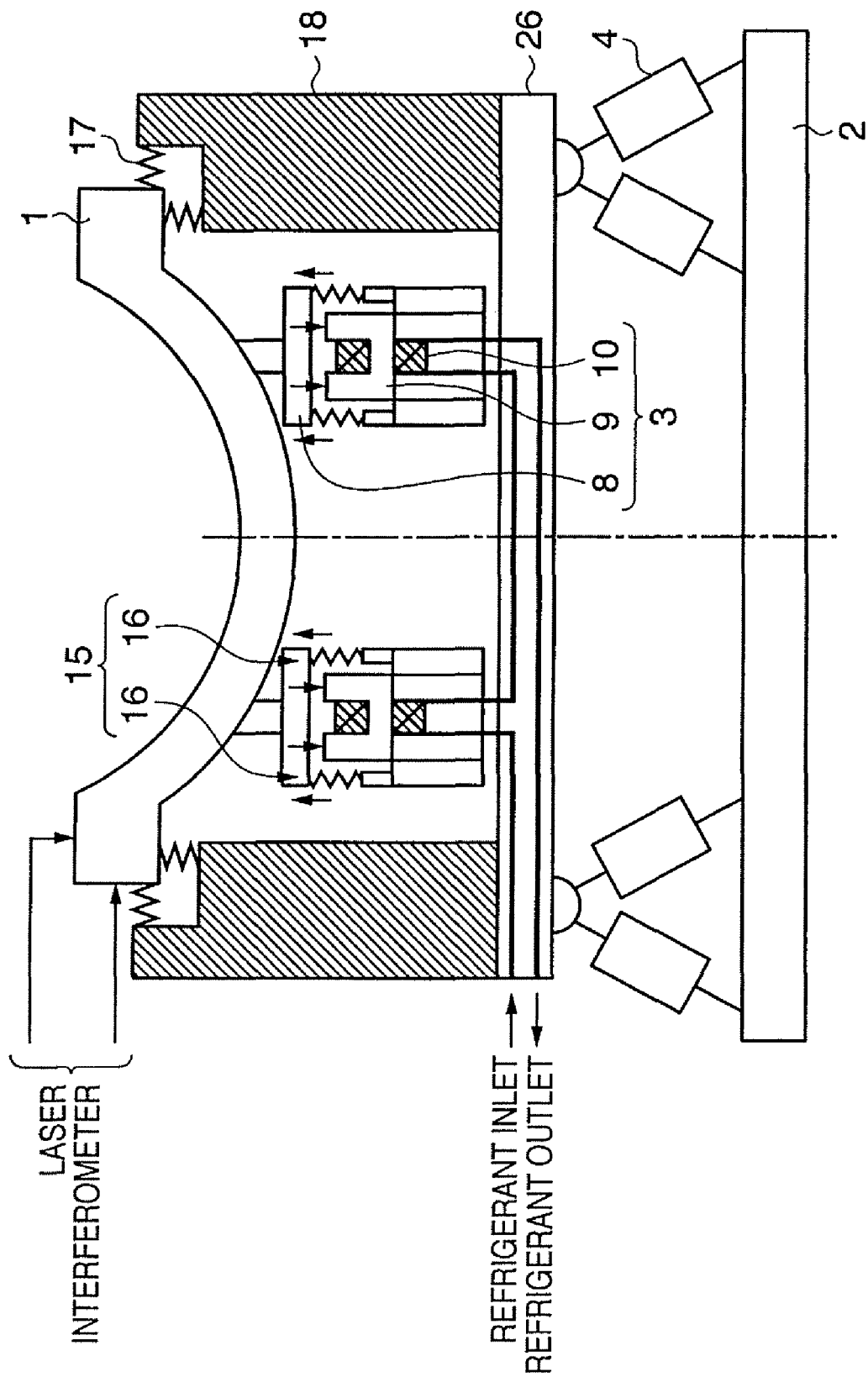
FIG. 12 is a view illustrating an example in which an actuator and an electromagnet unit are arranged in series.

FIG. 12 is a view showing still another modification. Although the actuator 4 and electromagnet unit 3 are interposed in parallel between the mirror 1 and the base 2 in the above-described embodiments, they are arranged in series with each other in FIG. 12. The intermediate member 18 holds the mirror 1 via the elastic member 17, and the electromagnet unit 3 and preload unit 15 are interposed between the intermediate member 18 and the mirror 1. The actuator 4 is interposed between the base 2 and the intermediate member 18. The intermediate member 18 forms a flow path where a refrigerant flows in and out.

Figure 13:
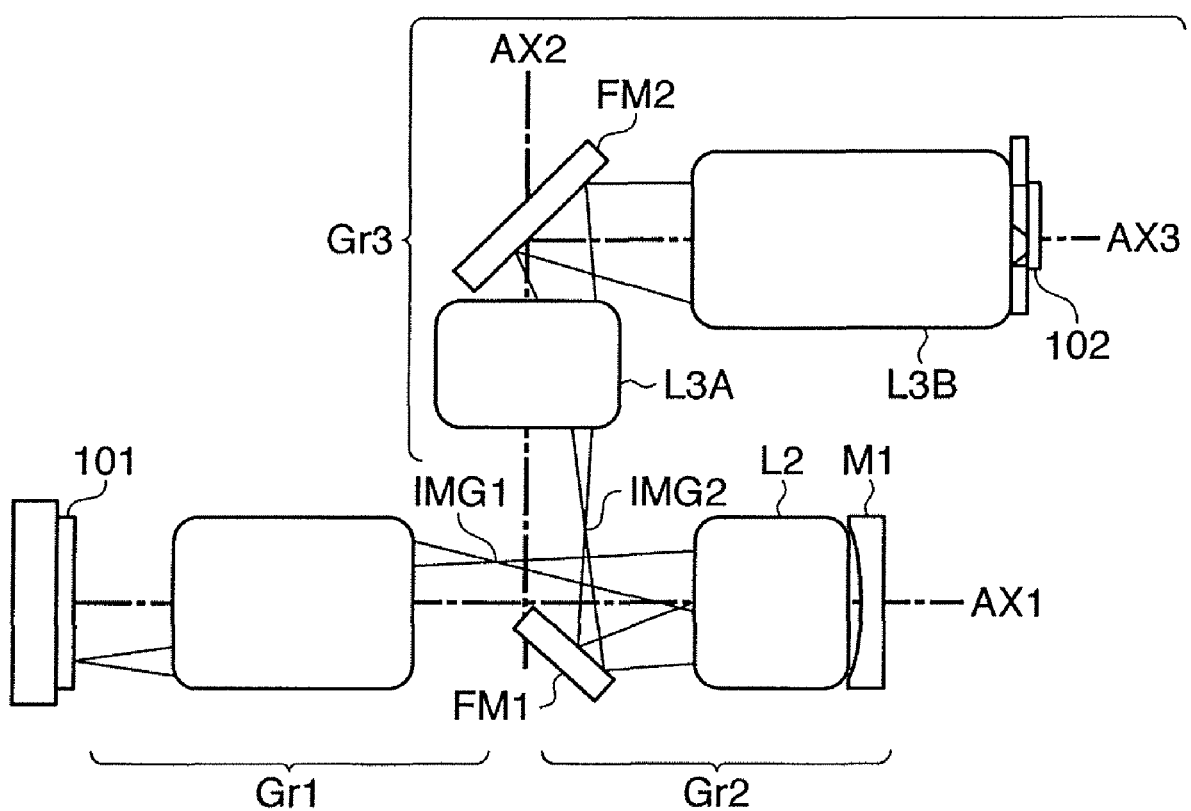
FIG. 13 is a view showing the schematic arrangement of an exposure apparatus.

An exposure apparatus to which the above-described reflecting apparatus is applied will be exemplified. FIG. 13 is a view schematically showing an exposure apparatus. The exposure apparatus comprises a light source, an illumination optical system for guiding the light from the light source to a reticle (original), a reticle stage for aligning the reticle, a projection optical system for projecting the reticle pattern onto a wafer (substrate), and a wafer stage for aligning the wafer. The projection optical system uses a catadioptric projection optical system. In the following explanation, a first object indicates the reticle, and a second object indicates the wafer.

The optical system here includes a first imaging optical system Gr1, a second imaging optical system Gr2, and a third imaging optical system Gr3, in the order in which the light beam passes from the object side. The first imaging optical system Gr1 forms a first intermediate image IMG1 as an image of a first object 101. The second imaging optical system Gr2, having a concave mirror M1 and reciprocating optical system portion L2, allows the light beam from the first intermediate image IMG1 to form a second intermediate image IMG2. A first deflecting/reflecting member FM1 deflects an optical axis AX1 and the light beam reflected toward the first object 101 by the reciprocating optical system portion L2 of the second imaging optical system Gr2. The third imaging optical system Gr3 forms a second intermediate image IMG2 with a predetermined magnification on a second object 102. A second deflecting/reflecting member FM2 in the third imaging optical system Gr3 deflects the light beam reflected by the first deflecting/reflecting member FM1. At the same time, an optical axis AX2 is deflected toward an optical axis AX3.

As described above, the three-stage imaging optical system is adopted to cause the first deflecting/reflecting members FM1 and FM2 and the concave mirror M1 in the second imaging optical system Gr2 to deflect the light beam. This makes it possible to avoid interference between the first object 101 and the lens, deflecting/reflecting member, and the like. In addition, the three-stage imaging optical system can implement a projection optical system, which images an off-axis light beam with a small effective diameter at a short object-to-image distance, without light shielding at the central portion of the pupil.

The second imaging optical system Gr2 has the concave mirror M1 and the reciprocating optical system portion (L2 in FIG. 13) where the light beam reciprocates. The concave mirror M1 is inserted on the linear optical axis AX1, which also serves as the optical axis of the first imaging optical system Gr1. The concave mirror M1 is arranged such that its concave surface opposes the reticle surface.

The light beam reflected by the concave mirror M1 in the second imaging optical system Gr2 passes through the reciprocating optical system portion L2 in the second imaging optical system Gr2. After that, the first deflecting/reflecting member FM1 bends the optical axis AX1 of the resultant light beam by 90° toward the optical axis AX2. At this time, the first deflecting/reflecting member FM1 is arranged to have a predetermined angle with respect to the optical axis, such that the light beam from the first imaging optical system Gr1 to the concave mirror M1 intersects with the light beam reflected by the concave mirror M1 and first deflecting/reflecting member FM1.

The second deflecting/reflecting member FM2 in the third imaging optical system Gr3 bends, by 90° toward the optical axis AX3, the optical axis AX2 of the light beam reflected by the first deflecting/reflecting member FM1. In this way, the two deflecting/reflecting members FM1 and FM2 bend the optical axis twice to arrange the first and second objects 101 and 102 in parallel. Hence, the first and second deflecting/reflecting members FM1 and FM2, as shown in FIGS. 1A and 1B, are arranged such that their reflection surfaces have a relative angular difference of 90°.

For the sake of simplicity, FIG. 13 shows the state in which the light beam emerging from one off-axis height (a position separated from the optical axis AX1) of the first object 101 forms an image on the second object 102. In practice, the light beam emerging from each off-axis height of the first object 101 within a certain range is used. The pattern in a rectangular slit area or arcuate slit area (exposure area) that does not include the optical axis, on the surface of the first object, is formed on the second object 102 by exposure.

An embodiment of a device manufacturing method using the above-described exposure apparatus will be described with reference to FIGS. 14 and 15.

Figure 14:
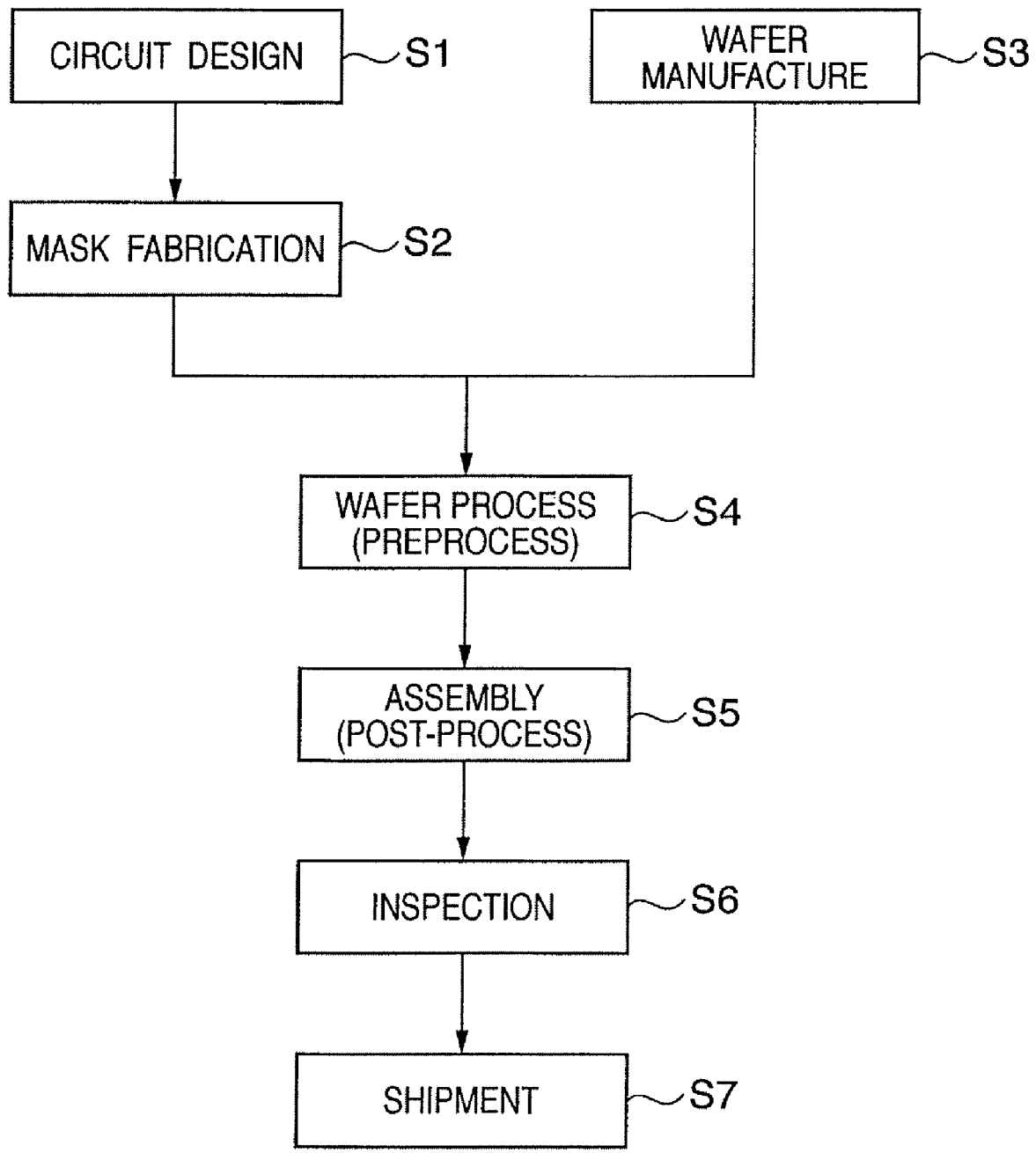
FIG. 14 is a flowchart for explaining a device manufacturing method.

FIG. 14 is a flowchart for explaining the manufacture of a device (e.g., a semiconductor chip, such as an IC or LSI, an LCD, or a CCD). A method of manufacturing a semiconductor chip will be exemplified here.

In step S1 (circuit design), the circuit of a semiconductor device is designed. In step S2 (mask fabrication), a mask is fabricated based on the designed circuit pattern. In step S3 (wafer manufacture), a wafer is manufactured using a material such as silicon.

In step S4 (wafer process), called a preprocess, the above-described exposure apparatus forms an actual circuit on the wafer by lithography using the mask and wafer.

In step S5 (assembly), called a post-process, a semiconductor chip is formed from the wafer manufactured in step S4. This step includes processes, such as assembly (dicing and bonding) and packaging (chip encapsulation).

In step S6 (inspection), inspections including an operation check test and a durability test of the semiconductor device manufactured in step S5 are performed. A semiconductor device is completed with these processes and shipped, in step S7.

Figure 15:
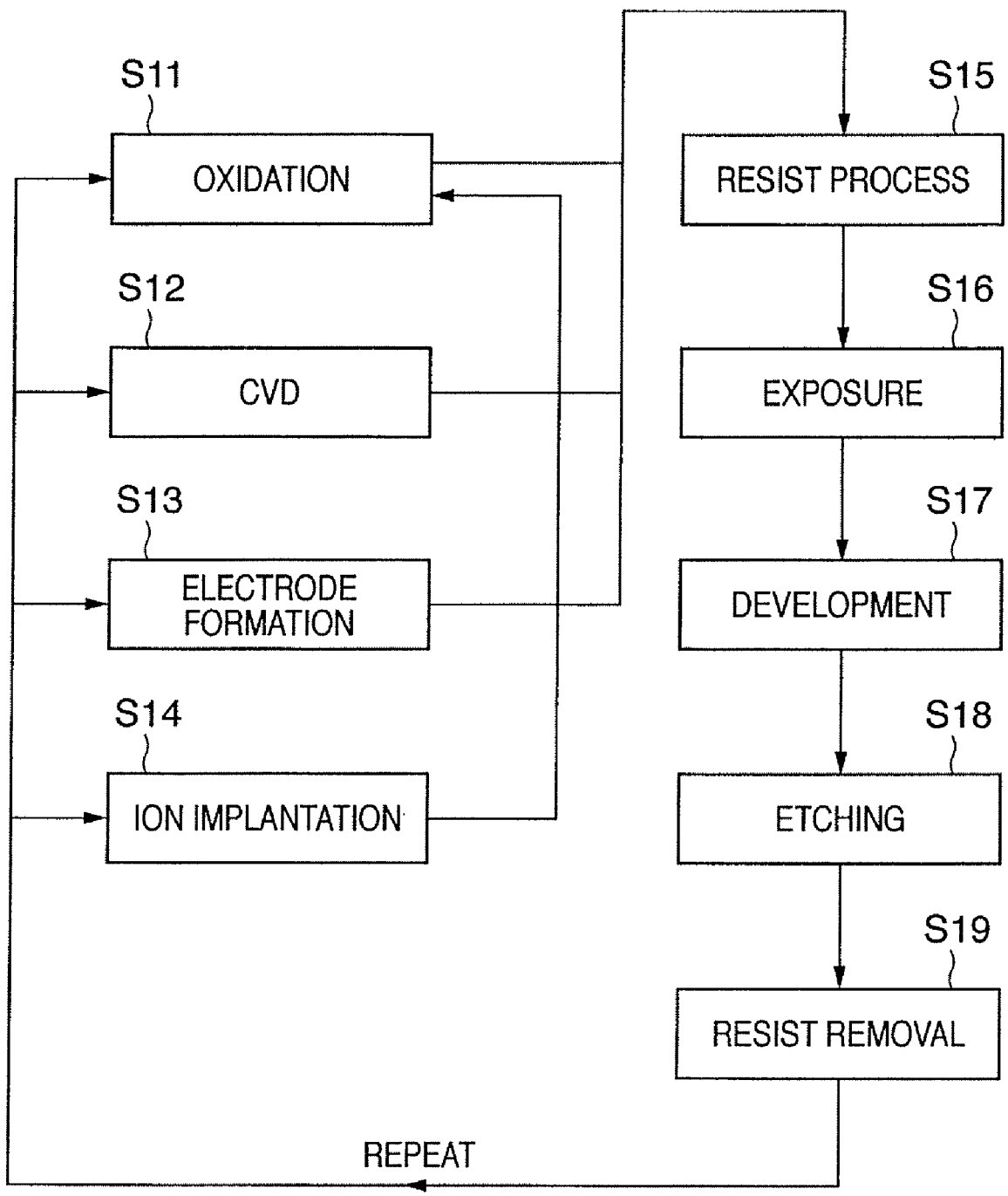
FIG. 15 is a flowchart for explaining the wafer process.
Figure 16:
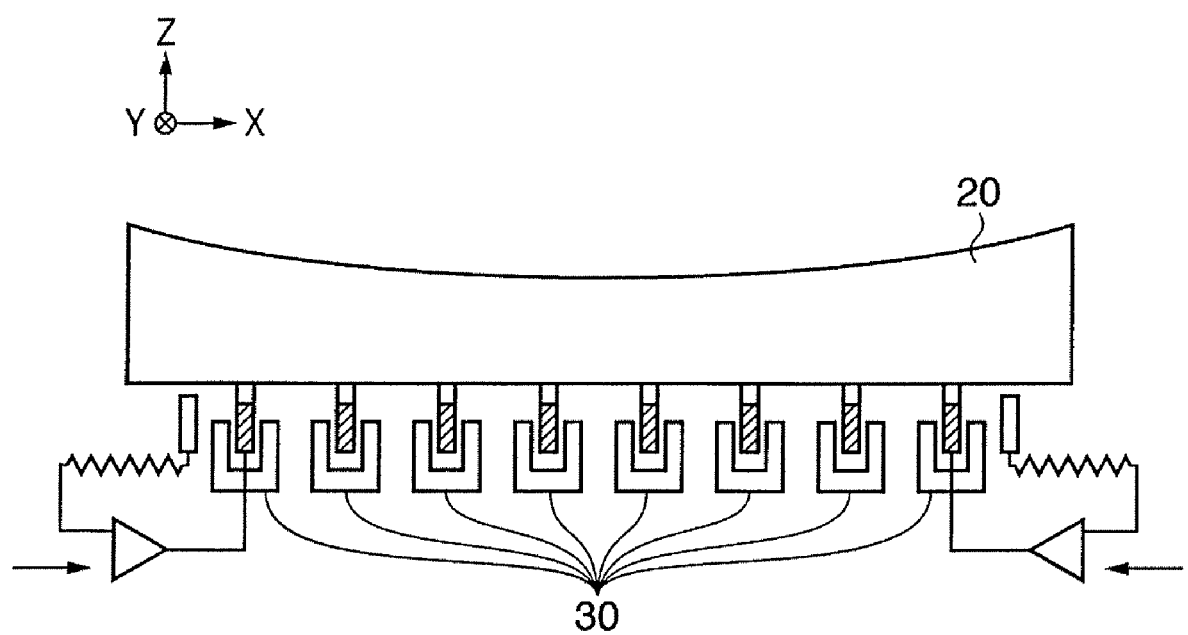
FIG. 16 is a view showing a prior art arrangement.

FIG. 15 is a flowchart showing details of the wafer process shown in step S4. In step S11 (oxidation), the surface of the wafer is oxidized.

In step S12 (CVD), an insulating film is formed on the wafer surface. In step S13 (electrode formation), an electrode is formed on the wafer by deposition.

In step S14 (ion implantation), ions are implanted into the wafer. In step S15 (resist process), a photosensitive agent is applied to the wafer.

In step S16 (exposure), the exposure apparatus forms the circuit pattern of the mask onto the wafer by exposure. In step S17 (development), the exposed wafer is developed.

In step S18 (etching), portions other than the developed resist image are etched. In step S19 (resist removal), any unnecessary resist remaining after etching is removed.

By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A reflecting apparatus comprising:
a mirror having an axis;
a holding unit configured to hold said mirror via an elastic member;
a first actuator configured to position said mirror by driving said holding unit;
a second actuator configured to deform said mirror, said second actuator including a magnetic member attached to said mirror and an electromagnet arranged to oppose said magnetic member, wherein said electromagnet includes a core member and a plurality of coils wound around said core member, and said electromagnet generates an attraction force between said magnetic member and said electromagnet;
a base configured to support said electromagnet;
a second base configured to support said first actuator, wherein said second base supports said base via an elastic member;
a spring interposed between said base and said mirror and configured to apply a force between said magnetic member and said electromagnet in a direction opposite to that of the attraction force, wherein a rigidity of said spring in a direction parallel to the axis is less than that of said elastic member in the direction parallel to the axis; and
a controller which controls currents supplied to said plurality of coils so as not to change a sum total of values of heat generated by said plurality of coils.

2. The apparatus according to claim 1, wherein said mirror has a mirror surface that reflects light, and said electromagnet applies a force to a rear side of the mirror surface.

3. The apparatus according to claim 1, further comprising a cooling unit configured to cool said electromagnet.

4. The apparatus according to claim 1, further comprising a measurement unit configured to measure a position of said mirror, wherein said controller is configured to control said first actuator based on a measurement result obtained by said measurement unit.

5. A reflecting apparatus comprising:
a mirror having an axis;
a holding unit configured to hold said mirror via an elastic member;
a first actuator configured to position said mirror by driving said holding unit;
a second actuator configured to deform said mirror, said second actuator including a magnetic member attached to said mirror and an electromagnet arranged to oppose said magnetic member, wherein said electromagnet includes a core member and a first coil and a second coil wound around said core member, and said electromagnet generates an attraction force between said magnetic member and said electromagnet;
a base configured to support said electromagnet;
a spring interposed between said base and said mirror and configured to apply a force between said magnetic member and said electromagnet in a direction opposite to that of the attraction force, wherein a rigidity of said spring in a direction parallel to the axis is less than that of said elastic member in the direction parallel to the axis; and
a controller configured to control currents supplied to said first coil and said second coil, so that a direction of a magnetic flux generated by supplying the current to said first coil becomes opposite to a direction of a magnetic flux generated by supplying the current to said second coil.

6. The apparatus according to claim 1, wherein said magnetic member is attached to said mirror via a connecting member, and a central axis of said connecting member substantially coincides with a line of action of a force produced by said electromagnet.

7. The apparatus according to claim 1, wherein said controller is configured to control, on the basis of a deformation target value of said mirror, a value of a current supplied to said electromagnet.

8. The apparatus according to claim 1, wherein said controller is configured to measure a value of a current supplied to said electromagnet, and to feedback-control said electromagnet based on the measured current value.

9. An exposure apparatus comprising:
a projection optical system which includes a reflecting apparatus defined in claim 1,
wherein said projection optical system projects a pattern of an original onto a substrate.

10. A device manufacturing method comprising steps of:
exposing a substrate to light of a circuit pattern using an exposure apparatus defined in claim 9; and
developing the exposed substrate.

11. The apparatus according to claim 5, wherein
said mirror has a mirror surface that reflects light, and said electromagnet applies a force to a rear side of the mirror surface.

12. The apparatus according to claim 5, further comprising a second base configured to support said first actuator, wherein said second base supports said base via an elastic member.

13. The apparatus according to claim 5, further comprising a cooling unit configured to cool said electromagnet.

14. The apparatus according to claim 5, further comprising a measurement unit configured to measure a position of said mirror, wherein said controller is configured to control said first actuator based on a measurement result obtained by said measurement unit.

15. The apparatus according to claim 5, wherein said magnetic member is attached to said mirror via a connecting member, and a central axis of said connecting member substantially coincides with a line of action of a force produced by said electromagnet.

16. The apparatus according to claim 5, wherein said controller is configured to control, on the basis of a deformation target value of said mirror, a value of a current supplied to said electromagnet.

17. The apparatus according to claim 5, wherein said controller is configured to measure a value of a current supplied to said electromagnet, and to feedback-control said electromagnet based on the measured current value.

18. An exposure apparatus comprising:
a projection optical system which includes a reflecting apparatus defined in claim 5,
wherein said projection optical system projects a pattern of an original onto a substrate.

19. A device manufacturing method comprising steps of:
exposing a substrate to light of a circuit pattern using an exposure apparatus defined in claim 18; and
developing the exposed substrate.

* * * * *